United States Patent
Hulbert

(10) Patent No.: US 8,030,931 B2
(45) Date of Patent: Oct. 4, 2011

(54) WIRELESS MAGNETIC RESONANCE IMAGING UPCONVERSION STAGE WITH A PARAMAGNETIC AMPLIFIER AND DELAY LINE CONVERTING RF SIGNALS TO MICROWAVE SIGNALS

(75) Inventor: Anthony Peter Hulbert, Southampten (GB)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/613,033

(22) Filed: Nov. 5, 2009

(65) Prior Publication Data
US 2010/0117643 A1 May 13, 2010

(30) Foreign Application Priority Data

Nov. 12, 2008 (GB) .................................. 0820688.0
Mar. 5, 2009 (GB) .................................. 0903726.8

(51) Int. Cl.
*G01V 3/00* (2006.01)
*G06K 9/00* (2006.01)

(52) U.S. Cl. ......... 324/322; 324/318; 324/307; 382/131
(58) Field of Classification Search .......... 324/300–322; 600/410, 411, 422, 423; 382/128–131
See application file for complete search history.

(56) References Cited

U.S. PATENT DOCUMENTS

| | | | |
|---|---|---|---|
| 2,860,278 A * | 11/1958 | Cook et al. ...................... 315/3.5 |
| 3,015,072 A * | 12/1961 | Schulz-Du Bois et al. ....... 330/4 |
| 3,588,678 A * | 6/1971 | Ernst .............................. 324/310 |
| 6,477,370 B1 * | 11/2002 | Sigler et al. ..................... 315/3.5 |
| 6,822,445 B2 * | 11/2004 | Vester ............................ 324/307 |
| 6,891,371 B1 * | 5/2005 | Frigo et al. ..................... 324/307 |
| 6,980,848 B2 * | 12/2005 | Helfer et al. ................... 600/423 |
| 7,173,426 B1 | 2/2007 | Bulumulla et al. ........... 324/318 |
| 7,389,137 B2 * | 6/2008 | Helfer et al. ................... 600/423 |
| 7,417,433 B2 * | 8/2008 | Heid et al. ..................... 324/318 |
| 2003/0062895 A1 * | 4/2003 | Vester ............................ 324/307 |
| 2003/0227289 A1 | 12/2003 | Heid et al. ..................... 324/314 |
| 2007/0013376 A1 * | 1/2007 | Heid et al. ..................... 324/309 |
| 2008/0246477 A1 | 10/2008 | Nakabayashi ................ 324/312 |
| 2009/0140739 A1 | 6/2009 | Bennett ......................... 324/318 |
| 2010/0117643 A1 * | 5/2010 | Hulbert ......................... 324/307 |
| 2010/0117646 A1 * | 5/2010 | Hulbert et al. ................. 455/427 |
| 2010/0117652 A1 * | 5/2010 | Cork et al. ..................... 324/322 |
| 2010/0119138 A1 * | 5/2010 | Hulbert ......................... 382/131 |
| 2010/0253345 A1 * | 10/2010 | Vester ............................ 324/316 |
| 2010/0253346 A1 * | 10/2010 | Hulbert ......................... 324/316 |
| 2010/0253349 A1 * | 10/2010 | Cork et al. ..................... 324/318 |
| 2010/0253350 A1 * | 10/2010 | Huish et al. ................... 324/318 |
| 2010/0253351 A1 * | 10/2010 | Huish et al. ................... 324/318 |
| 2010/0253352 A1 * | 10/2010 | Hulbert ......................... 324/318 |
| 2010/0253353 A1 * | 10/2010 | Cork et al. ..................... 324/318 |
| 2010/0253354 A1 * | 10/2010 | Hulbert et al. ................. 324/322 |
| 2011/0012596 A1 * | 1/2011 | Menon et al. ................. 324/309 |
| 2011/0059716 A1 * | 3/2011 | Cork .............................. 455/330 |

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

An upconversion stage for a wireless magnetic resonance imaging system local coil array has a number of upconversion circuits. Each upconversion circuit includes a parametric amplifier, an antenna and a delay line between the amplifier and the antenna. The path length of the delay line in one upconversion circuit differs from the path length of the delay line in an adjacent upconversion circuit by a predetermined amount.

7 Claims, 3 Drawing Sheets

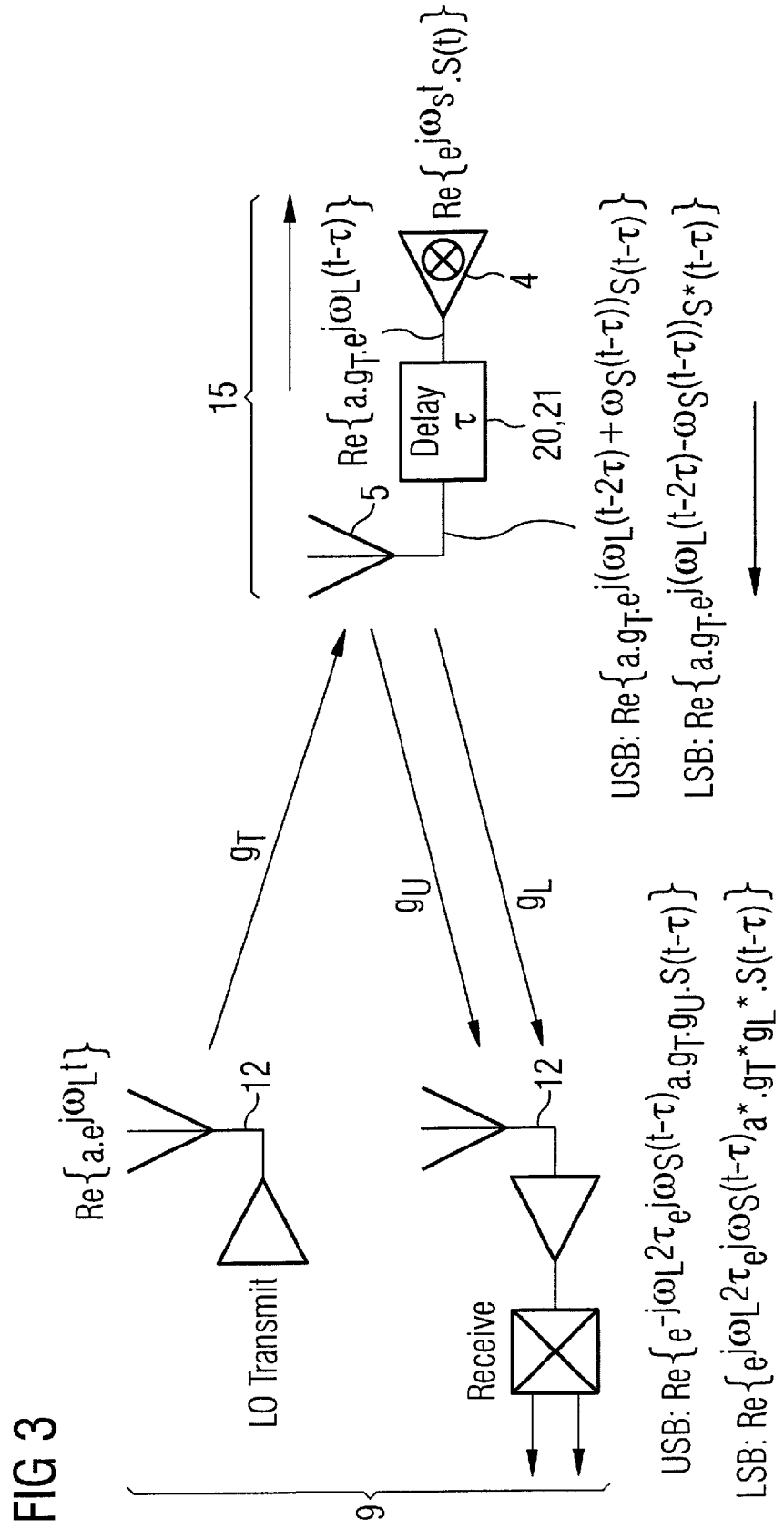

WIRELESS MAGNETIC RESONANCE IMAGING UPCONVERSION STAGE WITH A PARAMAGNETIC AMPLIFIER AND DELAY LINE CONVERTING RF SIGNALS TO MICROWAVE SIGNALS

BACKGROUND OF THE INVENTION

1. Related Applications

This application is related to the subject matter of the following applications filed simultaneously herewith, designated with Ser. Nos. 12/612,831 and 12/612,842 and 12/612,856 and 12/613,004 and 12/613,082.

2. Field of the Invention

The present invention relates to an upconversion stage for a local coil array, in particular a local coil array of the type providing phase scrambling for improved resolution in wireless coils magnetic resonance imaging (MRI).

3. Description of the Prior Art

MRI scanners use a combination of a strong constant magnetic field ($B_0$) from a superconducting magnet which is modified by gradient fields generated by gradient coils, together with a rotating magnetic field ($B_1$) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The coils that receive signals from the back of the patient are mounted in the patient table. Coils that receive signals from the front of the patient are arranged into 'blankets' that are carefully placed over the patient. Associated with each blanket is typically a flexible cable containing one co-axial line for each local coil. The cables potentially interact with the $B_1$ field and with the signals generated from the patient, so 'traps' (high impedance sections) must be included at regular (typically $\lambda/8$) intervals. These add cost and inconvenience to the structure.

In use, the requirement to connect the cables and sterilize them between scanning one patient and the next leads to increased down-time between scans. It is therefore desirable that the cables be eliminated. However, a wireless solution permitting the cables to be eliminated still needs to substantially satisfy all the requirements of the existing system, particularly with regard to noise.

SUMMARY OF THE INVENTION

In accordance with a first aspect of the present invention, an upconversion stage for a wireless magnetic resonance imaging system local coil array has a number of upconversion circuits and each upconversion circuit has a parametric amplifier, an antenna and a delay line between the amplifier and the antenna, with the path length of the delay line in one upconversion circuit being different from the path length of the delay line in an adjacent upconversion circuit by a predetermined amount.

Preferably, the predetermined amount is one eighth of a wavelength of a local oscillator signal.

Preferably, the upconversion stage has a number of rows of upconversion circuits arranged such that the path length of a delay line in any one upconversion circuit differs from the path length of any adjacent upconversion circuit both in the same row and in an adjacent row.

Preferably, the local oscillator frequency is in the range of 2 GHz to 3.5 GHz.

In accordance with a second aspect of the present invention, a local coil array for a wireless magnetic resonance imaging system has a number of local coils and an upconversion circuit according to the first aspect.

Preferably, adjacent local coils in the array are separated by a distance of less than or equal to half the wavelength of the local oscillator signal.

In accordance with a third aspect of the present invention, a wireless MRI system has a local oscillator, a microwave antenna array and associated transceivers; and a local coil array according to the second aspect, in which magnetic resonance signals received in the local coil array are upconverted and transmitted to the microwave antenna array, and upper and lower sideband signals are extracted.

BRIEF DESCRIPTION OF THE DRAWINGS

FIG. 3 illustrates the principles of operation of the wireless system of FIG. 1.

DESCRIPTION OF THE PREFERRED EMBODIMENTS

The wireless concept to which the features of the present invention apply is based on upconversion of the RF (Larmor) frequency signals to microwave frequencies and transmission from local coils located in the patient blanket to microwave antennas located on the bore of the scanner. The Larmor frequency $\omega_0$ is dependent upon the gyromagnetic ratio y and the magnetic field strength $B_0$. The combination of transmit and receive antennas on the patient and bore respectively constitutes a MIMO (Multiple Input/Multiple Output) system that allows individual signals from the patient antennas to be resolved. A wireless system greatly enhances the utility of MRI scanners by removing the requirement for cable connections to patient coils and gives rise to significant work flow benefits from eliminating the need to sterilise, connect and disconnect the cables. With substantially no reduction of bore size, an increased coil density above the current norms may be achieved, as well as improving scanner workflow. The present invention relates to an upconversion stage of a local coil array for use in a wireless MRI system.

Figure 1:
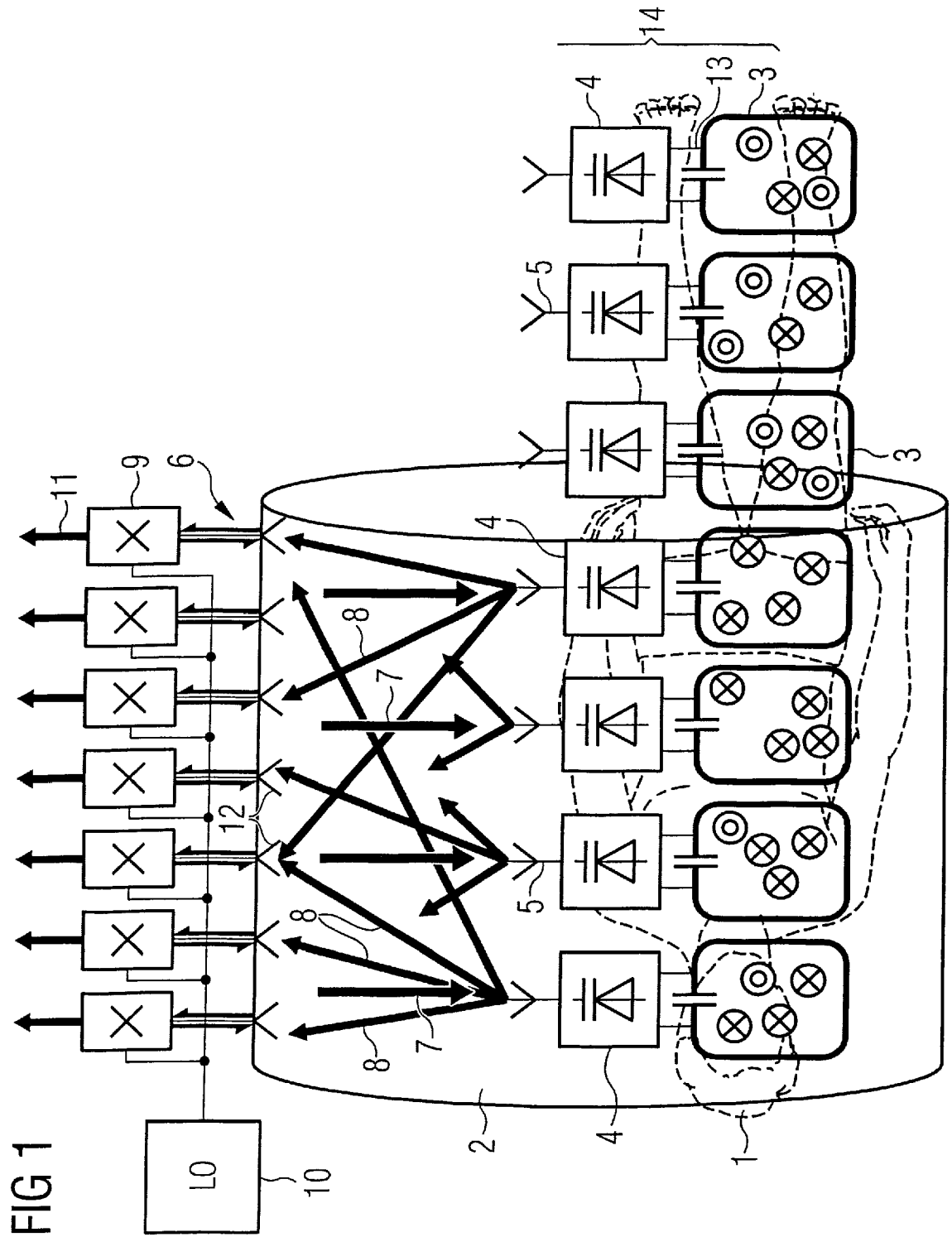
FIG. 1 illustrates a wireless MRI system incorporating an upconversion stage of a local coil array in accordance with the present invention.

An example of an MRI system using a MIMO microwave link, using an upconversion stage of a local coil array in accordance with the present invention will now be described. FIG. 1 shows a patient 1 within an MRI scanner bore tube 2. A blanket covers the patient and embedded in the blanket are a plurality of local coils 3 forming a local coil array 14. In the array, each local coil 3 has an associated upconverter 4 and microwave antenna 5. Transceivers 9, that include MR receivers and frequency downconverters, as well as local oscillator (LO) transmitters, are connected to an array 6 of antennas 12 which are integrated into the scanner bore 2. The frequency upconverter 4 for each patient mat local coil 3 produces signals for transmission to the array of transceivers 9 in the scanner bore 2. A signal from a local oscillator 10 feeds the antenna array 6 to illuminate the patient coil electronics 14 with a signal 7 at the local oscillator frequency. The same local oscillator signal in the transceivers converts microwave signals 8, received from the patient coil array at the LO frequency ±63 MHz, back to the original magnetic resonance (MR) frequency of 63 MHz for a 1.5 Tesla magnet for input 11 to the MR receivers in the transceivers 9. The local coil upconverters 4 are based on parametric amplifiers and implement low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6.

Increasing the density of wireless coils has the potential to achieve improved sensitivity when imaging part of the surface of a patient. Only those volumetric elements (voxels) that are close to the surface of the patient will be received with significantly different level at the closely spaced coils. For coils that are close together, when "looking" deeper into the patient, adjacent coils see the same voxels similarly, so the problem is mainly for voxels close to the surface. For such voxels it is necessary to be able to discriminate between signals received from the closely spaced coils. The spatial resolution of the wireless coils system is determined by the wireless coils microwave wavelength. Nominally the resolution is $\lambda/2$, where $\lambda$ is the local oscillator wavelength, which, for example, at a local oscillator frequency of 3 GHz corresponds to 5 cm, or for 2.442 GHz corresponds to approximately 6 cm. In reality, the resolution for uncompromised sensitivity will be somewhat poorer than this, partly because of the patterns of the antennas within the local coil array.

Figure 2:
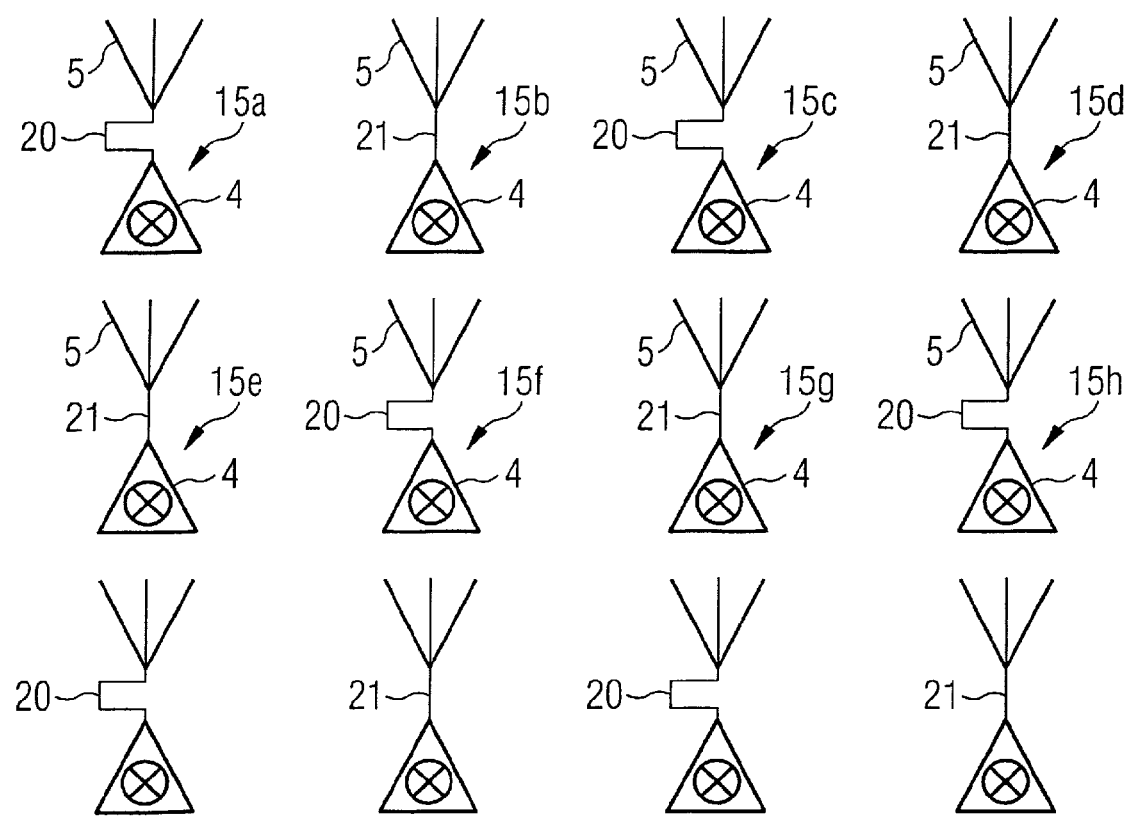
FIG. 2 illustrates the effect of path length changes in an example of an upconversion stage of the present invention.

Although interference between closely spaced coils can be mitigated by taking only one of the upper and lower sidebands from one coil and taking the opposite sideband from an adjacent coil, this is wasteful of spectrum. The present invention achieves full $\lambda/2$ resolution using both sidebands. An upconversion stage comprises a plurality of upconversion circuits 15, one for each local coil 3, each circuit comprising a parametric amplifier 4 and an antenna 5, the amplifier and antenna being connected together via a delay line 20, 21. By introducing a pattern of different path lengths between the parametric amplifiers 4 and the microwave patient antennas 5 as shown in FIG. 2, full $\lambda/2$ resolution using both sidebands is made possible. The delay lines 20, 21 have either a standard or an extended path length and are arranged so that neighbouring upconversion circuits have delay line path lengths which differ by one eighth of a wavelength. Thus, in the example shown, upconversion circuits 15b, 15d, 15e and 15g have a standard delay line path length and upconversion circuits 15a, 15c, 15f and 15h have an extended delay line path length.

The use of a local coil array with such a pattern where the path length difference corresponds to $\lambda/8$ has the effect that those circuits with an extended track have a path length difference between upper sideband (USB) and lower sideband (LSB) that is 180° different from those that do not. Thus, optimal combining of sidebands for circuits with the extended track is nominally cancelling for circuits without the extended track and vice versa. As a result, resolution is improved because the interference from the four nearest neighbours is substantially cancelled.

The fact that the $\lambda/8$ track has this effect can be understood by reference to sideband theory as illustrated in FIG. 3. A local oscillator signal is transmitted from an antenna 12 on the bore 2. The local oscillator is represented as $\text{Re}\{a.e^{j\omega_L t}\}$ where $\omega_L$ is the local oscillator frequency and a is the gain (note that a may incorporate a phase shift in which case it will be complex). The local oscillator passes over a radio path $g_T$ which is a complex number representing the path gain ($\ll 1$) and phase. The local oscillator then passes through a delay, $\tau$, that is either zero, for the case of no track 21, or $\pi/(4\omega_L)$ for the case where track 20 is present. After passing through the track the local oscillator becomes $\text{Re}\{a.g_T.e^{j\omega_L(t-\tau)}\}$. The Larmor signal is represented as $\text{Re}\{e^{j\omega_s t}.S(t)\}$ where $\omega_s$ is the signal (Larmor) centre frequency and S(t) is the complex baseband representation of the signal. This is multiplied by the local oscillator to create upper and lower sidebands. After passing back through the delay, $\tau$, the upper and lower sidebands become $\text{Re}\{a.g_T.e^{j(\omega_L(t-2\tau)+\omega_s(t-\tau))}S(t-\tau)\}$ and $\text{Re}\{a.g_T.e^{j(\omega_L(t-2\tau)-\omega_s(t-\tau))}S^*(t-\tau)\}$ respectively. The gain of the parametric amplifier has not been included—actually a gain of 2 is present, accounting for the creation of both sidebands.

The radio path gains for upper and lower sideband are designated $g_U$ and $g_L$ respectively. The magnitude of these gains will be fairly similar. After passing over these radio paths and being downconverted back to the Larmor frequency the upper and lower sidebands become $\text{Re}\{e^{-j\omega_L 2\tau}e^{j\omega_s(t-\tau)}a.g_T.g_U.S(t-\tau)\}$ and $\text{Re}\{e^{j\omega_L 2\tau}e^{j\omega_s(t-\tau)}a^*.g^*_T.g^*_L.S(t-\tau)\}$ respectively.

For the lower sideband, all gains in the path become conjugated, inverting the signs of the associated phase shifts. Paths from a pair of adjacent local coils to their nearest bore microwave antenna will have very similar values for a, $g_T$, $g_U$ and $g_L$. A maximal ratio combiner sets complex weights for the upper and lower sidebands to bring them into phase. Assuming that the only difference between the paths between a first local coil to a bore microwave antenna 14 and a second local coil to the microwave antenna is that the first path does not have a $\lambda/8$ track, but the second path does, then when weights are set for the first local coil to combine the upper and lower sidebands, the sidebands are brought into phase. The same weights are also applied for the second coil, which appears as effective interference to the first coil. However, the upper sideband is rotated an extra −90° and the lower sideband by an extra +90°. Thus, after phase compensation the two sidebands from the second local coil are 180° out of phase so, when added, will cancel.

The pattern described above and with respect to FIG. 2 may not be optimal for lower density local coil patterns because in lower density patterns, there is a natural three dimensional geometry which can bring about the desired effect and the use of such a pattern may break this. However, resolution of signals is straightforward for spacings above $\lambda/2$ (e.g. $\lambda$), so the present invention is not required in these cases.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. An upconversion stage configured for a local radiofrequency coil array of a wireless magnetic resonance imaging system, said upconversion stage comprising:
   a plurality of upconversion circuits, each upconversion circuit comprising:
      a parametric amplifier having an input that receives a magnetic resonance signal in the radio frequency range from a local coil,
      an antenna operating in the microwave range, and
      a delay line connected between the amplifier and the antenna,
   each of said upconversion circuits upconverting the magnetic resonance signal in said radiofrequency range to a signal in said microwave range that is radiated by said antenna; and
   each delay line in each upconversion circuit having a path length, and the path length of the delay line in one of said upconversion circuits being different, by a predetermined amount, from the path length of the delay line in another of said upconversion circuits that is adjacent to said one of said upconversion circuits.

2. An upconversion stage as claimed in claim 1 wherein each of said parametric amplifiers operates with a local oscillator signal, and wherein said predetermined amount is one eighth of a wavelength of said local oscillator signal.

3. An upconversion stage as claimed in claim 2 wherein said local oscillator frequency is in a range between 2GHz and 3.5GHz.

4. An upconversion stage as claimed in claim 1 wherein said plurality of upconversion circuits are arranged in respective rows of upconversion circuits, and wherein said path length of the delay line in any of said upconversion circuits differs from the path length of any upconversion circuit that is adjacent thereto in the same row and in an adjacent row.

5. A local coil array configured for a radiofrequency wireless magnetic resonance imaging system, comprising:
a plurality of local coils each configured to detect and emit a magnetic resonance signal; and
an upconversion stage comprising
a plurality of upconversion circuits, each upconversion circuit comprising
a parametric amplifier that receives said magnetic resonance signal in the radio frequency range from one of said local coils,
an antenna operating in the microwave range, and
a delay line connected between the amplifier and the antenna,
each of said upconversion circuits upconverting the magnetic resonance signal in said radiofrequency range to a signal in said microwave range that is radiated by said antenna and
each delay line in each upconversion circuit having a path length, and the path length of the delay line in one of said upconversion circuits being different, by a predetermined amount, from the path length of the delay line in another of said upconversion circuits that is adjacent to said one of said upconversion circuits.

6. A local coil array as claimed in claim 5 wherein said parametric amplifiers operate with a local oscillator signal, and
wherein adjacent local coils in said local coil array are separated from each other by a distance that is less than or equal to half of a wavelength of said local oscillator signal.

7. A wireless magnetic resonance imaging system comprising:
a magnetic resonance data acquisition unit comprising
a local oscillator,
a microwave antenna array and associated transceivers, and
a local coil array; said local coil array comprising
a plurality of local coils that respectively detect and emit magnetic resonance signals; and
an upconversion stage that upconverts the respective magnetic resonance signals emitted from the local coils of the local coil array in a radiofrequency range and transmits the upconverted signals in a microwave range to the microwave antenna array, said upconversion stage comprising
a plurality of upconversion circuits, each upconversion circuit comprising
a parametric amplifier that receives said magnetic resonance signal from one of said local coils, and
a delay line connected between the amplifier and an antenna in said microwave array, with each delay line in each upconversion circuit having a path length, and
the path length of the delay line in one of said upconversion circuits being different, by a predetermined amount, from the path length of the delay line in another of said upconversion circuits that is adjacent to said one of said upconversion circuits.

\* \* \* \* \*